(12) United States Patent
Schenk (10) Patent No.: US 7,078,778 B2
(45) Date of Patent: Jul. 18, 2006

(54) MICROMECHANICAL DEVICE

(75) Inventor: Harald Schenk, Dresden (DE)

(73) Assignee: Fraunhofer-Gessellschaft zur Foerderung der angewandten Forschung e.V., Munich (DE)

( * ) Notice: Subject to any disclaimer, the term of this patent is extended or adjusted under 35 U.S.C. 154(b) by 221 days.

(21) Appl. No.: 10/485,284

(22) PCT Filed: Jul. 26, 2001

(86) PCT No.: PCT/EP01/08674

§ 371 (c)(1),
(2), (4) Date: Jan. 26, 2004

(87) PCT Pub. No.: WO03/010545

PCT Pub. Date: Feb. 6, 2003

(65) Prior Publication Data

US 2004/0183149 A1 Sep. 23, 2004

(51) Int. Cl.
*H01L 29/84* (2006.01)
*H01L 29/82* (2006.01)
*H01L 27/14* (2006.01)

(52) U.S. Cl. .................. 257/417; 257/415; 257/414; 438/50

(58) Field of Classification Search ............... 257/414, 257/415, 417, 418; 438/50
See application file for complete search history.

(56) References Cited

U.S. PATENT DOCUMENTS

| | | | | |
|---|---|---|---|---|
| 6,188,504 B1 * | 2/2001 | Murakami et al. | ........... | 359/224 |
| 6,470,110 B1 * | 10/2002 | Lin | ............... | 385/18 |
| 6,661,637 B1 * | 12/2003 | McIntosh et al. | ........... | 361/233 |
| 6,734,512 B1 * | 5/2004 | Suzuki | ........................ | 257/414 |
| 6,734,762 B1 * | 5/2004 | Cornett et al. | .............. | 333/186 |
| 2002/0145493 A1 * | 10/2002 | Wang | ........................... | 335/78 |
| 2002/0149072 A1 * | 10/2002 | Mutoh et al. | ................ | 257/415 |

* cited by examiner

*Primary Examiner*—Nathan J. Flynn
*Assistant Examiner*—Victor A. Mandala, Jr.
(74) *Attorney, Agent, or Firm*—Michael A. Glenn; Glenn Patent Group (57) ABSTRACT

A micromechanical device comprises a substrate and a member which is moveably attached to the substrate, wherein the member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, and wherein the substrate comprises a third electrode which is at least partially arranged opposed to the first electrode and the second electrode.

20 Claims, 7 Drawing Sheets

MICROMECHANICAL DEVICE

BACKGROUND OF THE INVENTION

Field of the Invention

The present invention relates to a micromechanical device having a single static electrode, and in particular to a micromechanical sensor for determining a power, acceleration or angular acceleration, and to a micromechanical actuator for the continuous or quasi-static deviation of light.

Description of Prior Art

A plurality of micromechanical actuators and sensors is based on the dependence of electrostatic capacities between static electrodes and an electrode on a moveable device on a deflection state of the device. The dependence of the one or the several capacities on the deflection state of a device may on the one hand be used in a sensor to detect the deflection state of a device using a capacity measurement. On the other hand the dependence of a capacity on the deflection state of the device causes that during the application of a voltage to the capacity a power operating on the moveable device influences its deflection state. This is the basis of micromechanical, electrostatically driven actuators.

In many cases, for fulfilling the functionality of an actuator or a sensor, respectively, a deflection of a device which is moveably attached or suspended, respectively, to a substrate via one or several springs or elastic connecting elements, respectively, wherein the deflection of the moveable device or body, respectively, needs to be possible at least in one degree of freedom or one dimension. To this end, opposed to the moveable device several electrodes are arranged, which are electrically contactable independent from each other, which are attached directly or indirectly to the substrate statically or fixed with respect to the substrate, respectively. To operate this micromechanical device as an actuator, one or several voltages are respectively applied on the same between a static electrode and the moveable device or an electrode, respectively. Depending on the fact between which static electrode and the moveable device an electric voltage is applied, the moveable device is deflected in the direction of the respective static electrode.

In order to use the described micromechanical device as a sensor, one or several electrostatic capacities are measured between one static electrode and the moveable device, respectively. A change of capacity between a certain static electrode and the movable device enables a direct conclusion to a deflection of the movable device in the direction of the static electrode towards the same or away from the same.

Figure 5:
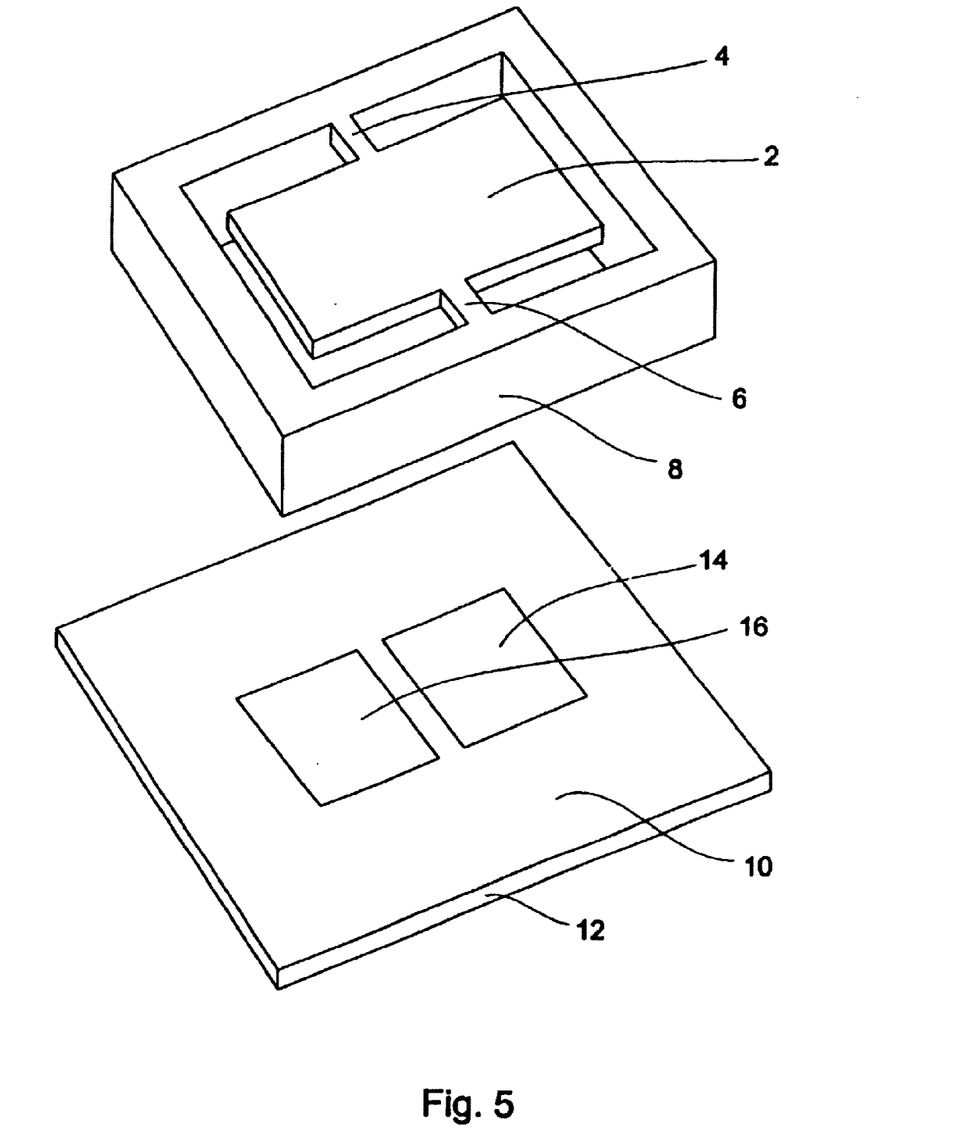
FIG. 5 shows a schematical perspective illustration of a micromechanical device according to the prior art.

FIG. 5 is a schematical perspective illustration of a micromechanical device according to the prior art. The micromechanical device comprises a moveable member 2, which is attached to a frame 8 using a first elastic connecting element 4 and a second elastic connecting element 6. The moveable member 2 is typically substantially plate-shaped and integrally implemented with the elastic connecting elements 4, 6 and the frame 8 or parts of the frame 8. The frame 8 is attached on a surface 10 of a substrate 12. Although the moveable member 2, the elastic connecting elements 4, 6 and the frame 8 on the one hand and the substrate 12 on the other hand are illustrated in a spatially separated way, to be able to illustrate the surface 10 of the substrate 12, the frame 8 is attached to the surface 10 of the substrate 12 with a functional micromechanical device of the illustrated basic type. The frame only illustrates one possibility in an exemplary way, how the elastic connecting elements 4, 6 may be mechanically rigidly connected to the substrate 12. On the surface 10 of the substrate 12 two electrodes 14, 16 are further arranged opposite to the moveable member 2 which are electrically insulated from each other and from the moveable member 2.

The moveable member 2 and the elastic connecting elements 4, 6 comprise electrically conductive materials or are provided with a continuous electrically conductive layer on one surface. The substrate 12 typically comprises an electrically insulating material, wherein the electrodes 14, 16 are metal layers on the surface 10 of the substrate 12, or the substrate 12 comprises a semiconductor material, which is doped in the areas of the electrodes 14, 16 and is therefore electrically conductive and which is undoted and therefore electrically insulating outside the areas of the electrodes 14, 16.

The moveable member 2 comprises an inoperated position defined by the elastic connecting elements 4, 6, in which it is aligned in parallel to the surface 10 of the substrate 12 in the present example. The moveable member 2 may be deflected from this inoperated position by an external force or by an angular acceleration, wherein this deflection is bigger the stronger the force or the greater the acceleration, respectively.

A first electrostatic capacity between the first electrode 14 and the moveable member 2 and a second elect rostatic capacity between the second electrode 16 and the moveable member 2 are dependent on the deflection state of the moveable member 2. When the moveable member 2 tilts to the lefts with reference to the illustration in FIG. 5, it approaches the second electrode 16 and moves away from the first electrode 14, whereby the first capacity between the first electrode 14 and the moveable member 2 decreases and the second capacity between the second electrode 16 and the moveable member 2 increases. If the moveable member 2 contrarily tilts to the right with reference to the illustration in FIG. 5, the first capacity increases and the second capacity decreases.

Apart from an optimization of the micromechanical device principally illustrated in FIG. 5 for a concrete object or application, respectively, it may be operated both as a sensor and as an actuator. When the micromechanical device is operated as a sensor, the moveable member 2 is preferably suspended asymmetrically and the first capacity and the second capacity are measured by a not illustrated electronic evaluation means and from its measurement values the deflection state of the moveable member 2 is determined. From this, with a known elasticity of the connecting elements 4, 6, the acting force or acceleration may be determined.

When the micromechanical device is operated as an actuator, by a not illustrated means a first voltage between the first electrode 14 and the moveable member 2 and a second voltage between the second electrode 16 and the moveable member 2 is applied. These electric voltages generate forces which act on the areas of the moveable member 2 opposed to the respective electrode 14,16 and altogether result in a deflection of the moveable member 2 from its inoperated position. When, for example, the surface of the moveable member 2 facing away from the substrate 12 is implemented in a level and light-reflecting way, a deflection of the moveable member 2 caused by the two electric voltages may be used to reflect light, for example a laser beam, under a desired angle which may be set by the choice of the first and the second voltage. For manufacturing a micromechanical device, as it is schematically illustrated in FIG. 5, basically two methods are suitable, which are illustrated in the following.

With the hybrid construction, the first electrode 14 and the second electrode 16 are separated from the moveable member 2 as static counter-lectrodes, i.e. manufactured on a second work piece or wafer, respectively. In the article "Electrostatically actuated micromirror devices in silicon technology" by W. Lang et al. (Sensors and Actuators 74 (1999) 216-218) a member for deflecting light is described, wherein two static counter-electrodes which are controlled independent from each other are manufactured on a first wafer. The same is connected to a Pyrexplate by anodic bonding. A movable member suspended via springs or elastic connecting elements, respectively, is manufactured in a second wafer. Subsequently, the second wafer is also connected to the Pyrexplate by anodic bonding, so that the moveable member is opposed to the two static counter-electrodes. A corresponding construction is also described in the article "Electrostatically driven micromirrors for a miniaturized confocal laser scanning microscope" by U. Hofmann et al. (part of the "SPIE Conference on Miniaturized Systems with Micro-Optics and MEMS", Santa Clara, September 1999, SPIE Vol. 3678, pp. 29-38).

In the article "Laser Display Technology" by J. Kränert et al. ("The eleventh Annual Intentional Workshop on Micro Electro Mechanical Systems", Jan. $25^{th}$ to $29^{th}$ 1998, Heidelberg, IEEE catalogue No. 98CH36176, pp. 99–103) a micromirror array is described which comprises a glass wafer and a silicon wafer. Into the glass wafer cavities are etched into which electrodes are inserted to obtain a distance between the electrodes and the mirror plates. By wet-etching and chemically-mechanically polishing 15 µm thick membranes are produced. The mirror form is manufactured by plasma etching. The silicon wafer and the glass wafer are connected by anodic bonding. To this end, both in this and also in a further described method two static electrodes each are opposed to a micromirror.

U.S. Pat. No. 5,097,354 describes a beam sampling device or a beam scanner, respectively, having a light-emitting element and a moveable, reflective mirror. On the surface of one electrode base four static electrodes are formed. Opposed to the four coplanar electrodes the mirror is connected to a mirror bases via torsion bars, which are rigidly mounted to the electrode basis using pins.

U.S. Pat. No. 4,317,611 describes a light-beam deflection device of the torsion-type, which comprises two etched plates. One of the two comprises a monocrystalline semiconductor material, like e.g. silicon, the other plate comprises a suitable insulating material, like e.g. glass. The semiconductor plate is etched to form an oblong bar having a broader middle section which comprises a reflective surface. In the middle of the insulating plate a depression is etched, wherein an oblong ridge may come to lie in the middle of the insulating plate under the area comprising the reflective surface and the torsion bar, to support the same in the direction perpendicular to its longitudinal axis, wherein its rotation around the longitudinal axis is enabled. In the depression within the insulating plate level electrodes are disposed which are provided to cause an electrostatic force between one of the level electrodes and the semiconductor device and therefore cause an angular deflection around the longitudinal axis of the torsion bars.

U.S. Pat. No. 5,629,790 describes micro-processed torsion scanners wherein two electrodes are respectively opposed to one mirror held by torsion bars in the different proposed geometries. A silicon member comprising the mirror and a dielectric substrate comprising the two electrodes are manufactured separately.

One advantage of the hybrid construction is that it does not comprise an inherent limitation of the distance between the moveable member and the static counterelectrodes, so that also great distances are possible and consequently great deflections of the moveable member may be generated or detected, respectively.

One disadvantage of the hybrid construction is the cost- and time-consuming manufacturing process which is based on the use and processing of several wafers. As the static counter-electrodes manufactured on a wafer must be aligned with a high precision with respect to the moveable members manufactured on another wafer and opposed to the elastic connecting elements, the two wafers must be aligned before a bonding process with just this high accuracy, from which a substantial manufacturing effort results. Apart from that, the construction and connection technology is cost- and time-consuming, as the static counter-electrodes and the moveable member are not arranged in a coplanar way and therefore also their electrical contacting is firstly required in two different levels. Also a contacting of the static counter-electrodes via the substrate or the member backside, respectively, is not easily possible, as two electrically independent electrodes need to be contacted.

In an integrated construction using a so-called sacrificial layer the member suspended moveable via elastic connecting elements and the static counterelectrodes are manufactured on one single substrate. To this end, first of all the static counter-lectrodes are manufactured on the substrate. Then, the sacrificial layer is applied to the substrate containing the static counter-electrodes. On the sacrificial layer a layer of an electrically conductive material is applied and structured in the desired form of the moveable member and the elastic connecting elements. Subsequently, the sacrificial layer is removed and therefore the moveable member and the elastic connecting elements are revealed.

The article "Novel beam steering micromirror device" by R. W. Fuchs et al. (part of the "SPIE Conference on Miniaturized Systems with Micro-Optics and MEMS", Santa Clara, September 1999, SPIE Vol. 3878, pp. 40–49) describes a micromirror device for light modulation, wherein an electrically conductive mirror plate is arranged substantially in parallel to a substrate having several static electrodes and connected to the substrate via an elastic joint structure laterally centrically arranged between the mirror plate and the substrate. The static electrodes, the elastic joint structure and the mirror plate are subsequently manufactured directly on the substrate and using a sacrificial layer which is subsequently removed.

The article "Design and fabrication of micromirror array with hidden joint structures" by C.-H. Ji and Y.-K Kim (part of the "SPIE Conference on Miniaturized Systems with Micro-Optics and MEMS", Santa Clara, September 1999, SPIE Vol. 3878, pp. 71-77) describes the design and the manufacture of an array of micromirrors having microprocessed surfaces. A mirror plate is substantially arranged in parallel to a substrate comprising several electrodes and is spaced apart from the same. The mirror plate and substrate are moveably connected to each other by a connecting structure centrically arranged between the two, wherein the connecting structure comprises a pin and clamps, and wherein a movement of the mirror plate around an axis defined by the pin is enabled.

The article "Micromirrors for direct writing systems and scanners" by H. Lakner et al. (part of the "SPIE Conference on Miniaturized Systems with Micro-Optics and MEMS", Santa Clara, September 1999, SPIE Vol. 3878, pp. 217–227) describes cantilever beam micromirrors which include stand-alone mirror elements which are held by support pillars via an air gap and a lower address electrode.

In the integrated construction the sacrificial layer is removed either wet-chemically or using a reactive gas. With dimensions of the moveable member of more than several micrometers additional openings in the moveable member are required to enable the removal of the sacrificial layer. These openings reduce the optical quality of the surface of the moveable member which restricts its usage as an electrostatically controllable mirror in optical applications. Also the thickness of the sacrificial layer is restricted for reasons of the planarity and the production of pillars which illustrate the mechanical connection of the elastic connecting elements to the substrate. Thus, the maximum deflection of the moveable member is restricted. For some applications it is decisive, however, to enable a large change of the electrical capacity between one stationary electrode each and the moveable member for generating or detecting, respectively, a deflection of the moveable member and simultaneously enable a large maximum deflection of the moveable member. This requirement is for example present in electrostatically driven scanners. As the thickness of the sacrificial layer is restricted to few micrometers, however, the deflection angle in the case of a moveable member with large dimensions, i.e. dimensions in the range of several micrometers, is so small that the use of such members is strongly restricted.

In a moveable member described in the above-mentioned article "Novel beam steering micromirror device" having dimensions of 300 µm×300 µm, due to the restriction of the thickness of the sacrificial layer to several micrometers a deflection angle of only two degrees is obtainable. The field of the use of the device is therefore strongly restricted. The same applies to the device described by Ji and Kim. The micromechanical devices described by Lakner et al. either comprise only one single pair of opposing electrodes, which is the reason why the moveable member may be deflected from the inoperated position only in one direction, or only comprise electrodes, which drive the moveable member into the inoperated position and are therefore only useable as an actuator which oscillates using its inherent frequency. To this end, in the production of the device described by Lakner et al. no sacrificial layer is used.

U.S. 6,188,504 B1 describes an optical scanner comprising a support member for mounting on a given member, a moveable plate with a reflective surface for reflecting light, and an elastic member that couples the moveable plate and the support member to each other. The elastic member comprises a plurality of laminated organic elastic insulating layers. An actuator is at least provided on the moveable plate for generating a driving force between the moveable plate and the support member. An electrical element is provided to apply a predetermined electrical signal to the actuator and thus generate the driving force, whereby the elastic member is elastically deformed and the moveable plate is deflected. The electrical element is provided between the organic elastic insulating layers of the elastic member. According to one embodiment, the actuator is an electrostatical actuator, wherein two moveable electrodes are provided on the surface of the moveable plate and one stationary electrode is provided on a fixed member.

SUMMARY OF THE INVENTION

It is the object of the present invention to provide a micromechanical device whose moveable member is cheaper, thinner and easier to produce, comprises a higher quality as a resonant system, and to provide a micromechanical sensor, and a micromechanical actuator with this device.

According to a first aspect of the invention, this object is achieved by a micromechanical device including a substrate and a member which is moveably attached to the substrate, wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, and wherein the substrate comprises a third electrode which is opposed at least partially to the first electrode and the second electrode.

According to a further aspect of the invention, the above object is achieved by a sensor including such a micromechanical device and wherein the moveable member is provided to be deflected by an exterior force, acceleration or angular acceleration, wherein a first capacity between the first electrode and the third electrode and a second capacity between the second electrode and the third electrode depend on a deflection state of the moveable member.

According to a further aspect of the invention, the above object is achieved by an actuator having a micromechanical device as described above and wherein the moveable member is provided so that between the first electrode and the third electrode a first voltage and between the second electrode and the third electrode a second voltage is applied, wherein a deflection state of the member depend on the first voltage and the second voltage.

Preferably, the moveable member is plate-shaped and comprises a first surface and a second surface, wherein the first electrode and the second electrode respectively occupy at least one partial area of the first surface or a partial area of the second surface.

According to a preferred embodiment, the micromechanical device further comprises a first and a second torsion-elastic or bending-elastic connecting element, which respectively connect the moveable member to the substrate. The moveable member and the connecting elements may comprise the same material.

According to a further preferred embodiment of the present invention, the micromechanical device further includes a frame, a first and a second elastic connecting element, via which the moveable member is rotatably connected to the frame at two opposing sides around a first axis, and a third and a fourth elastic connecting element, via which the frame is rotatably connected to the substrate at two opposing sides around a second axis, wherein the first axis and the second axis are substantially perpendicular to each other and wherein the moveable member further comprises a third electrode and a fourth electrode. The moveable member, the elastic connecting elements and the frame may comprise the same material.

In one of the described micromechanical devices according to the present invention, the moveable member may essentially consist of one electrically conductive material, wherein a first area of the moveable member forms the first electrode, a second area of the moveable member forms the second electrode, and the first electrode and the second electrode are connected to each other in a mechanically rigid way by an electrically insulating third area and are electrically insulated from each other by the same. The material of the moveable member may be a semiconductor material which is doped and electrically conductive in the areas forming the first electrode and the second electrode and which is undoped in the electrically insulating third area.

Alternatively, the electrically insulating third area may comprise a trench filled up with an electrically insulating material. If the moveable member and the connecting elements comprise the same material, then the first connecting element may connect the first electrode to a first electric conductor in an electrically conductive way and the second connecting element may connect the second electrode to a second electric conductor in an electrically conductive way, so that via the first electric conductor and the first connecting element a third electric potential may be applied to the first electrode and via the second electric conductor and the second connecting element a second potential may be applied to the second electrode, which is independent of the first electric potential.

Alternatively, with one of the above-described micromechanical devices according to the present invention, the moveable member may substantially comprise one electrically insulating material, wherein the first electrode and the second electrode respectively comprise one electrically conductive layer on one surface of the moveable member.

The substrate of a micromechanical device according to the present invention may comprise any electrically conductive material, wherein the substrate may further comprise a layer or a frame of an electrically insulating material, wherein the first electrode and the second electrode as well as an electrical connection of the same, for example via the connecting elements and the electric conductors, are electrically insulated from the third electrode, which is formed by the electrically conductive material of the substrate, by the layer or frame of the electrically insulating material.

Alternatively, the substrate of a micromechanical device according to the present invention may comprise an electrically insulating material, wherein the third electrode is formed on a surface of the substrate opposing the moveable member by metallization.

Alternatively, the substrate of a micromechanical device according to the present invention may comprise a semiconductor material, wherein the third electrode includes a doped area of the substrate.

The substrate of a micromechanical device according to the present invention may comprise a base plate or a wall of a housing in or at which the micromechanical device is attached, or an electrically conductive portion of the same, respectively.

A micromechanical device according to the present invention may also comprise a further electrode which is arranged in an immobile way with reference to the substrate and which is arranged symmetrically to the third electrode with reference to the moveable member.

In one micromechanical device according to the present invention, the moveable member may be moveably attached to the substrate using one or several elastic connecting elements or a suitable joint, so that it is tiltable or rotatable with reference to the same around one or several axes and/or translatable or shiftable, respectively, along one or several further axes.

Several micromechanical devices according to the present invention may be arranged in a linear or one-dimensional, respectively, or in a two-dimensional array, wherein the moveable members of the individual micromechanical devices are controlled in parallel and deflected synchronously, or, however, may be controlled or deflected individually and independent of each other or asynchronously, respectively.

A micromechanical device according to the present invention may be provided as a component of a sensor, wherein the moveable member is deflectable by an exterior force, acceleration or angular acceleration, wherein a first electrostatic capacity between the first electrode and the third electrode and a second electrostatic capacity between the second electrode and the third electrode depend on a deflection state of the member. By a measurement of the first capacity and the second capacity, depending on the implementation of the moveable member a determination of the force, acceleration or angular acceleration acting on the same is possible. In particular, for example a micromechanical device having a moveable member which is moveably suspended only around one axis through its center of gravity, is suitable to detect solely one component of an angular acceleration in that direction of the axis, not, however, other components of an angular acceleration or a linear acceleration. A moveable member which is moveably suspended solely around one axis, which does not contain the center of gravity of the moveable member, is suitable to detect an acceleration in a direction perpendicular to a plane which is defined by the axis and the center of gravity of the moveable member.

A micromechanical device according to the present invention may be a component of an actuator, wherein the moveable member is provided so that between the first electrode and the third electrode a second voltage and between the second electrode and the third electrode a second voltage is applied, wherein a deflection state of the member depends on the first voltage and the second voltage. The actuator may for example be provided for a controllable deviation of light, which is reflected at a light-reflecting surface of the moveable member.

One advantage of the present invention is, that it only comprises one static electrode or counter-electrode, respectively, i.e. the third electrode, whose lateral deflection may be of any size, so that in case of a hybrid construction of the inventive micromechanical device a lateral alignment of a first wafer including the moveable member and a second wafer including the third electrode is not required.

A further advantage of the present invention is, that the first and the second electrode are easily contactable, as they are arranged with the moveable member generally at the surface of the micromechanical device. Only one electrode, the third electrode, is arranged opposed to the first and the second electrode in another plane. Contacting them is also easily possible, that is via the backside of the micromechanical device or via a housing which may be part of the micromechanical device. This advantage gets more important when a moveable member comprises several degrees of freedom and accordingly additional electrodes are required or when several micromechanical devices are implemented on one wafer. In this case, it is not required, as according to the prior art, to electrically contact a plurality of electrodes independent of each other, which lie in a different plane than the moveable member and are therefore generally not easily contactable. Rather, with a micromechanical device according to the present invention, also in the case of several degrees of freedom or a plurality of moveable members only one electrode, i.e. the third electrode, needs to be contacted, which lies in another plane than the one or the several moveable members. All further electrodes are arranged at the one or the several moveable members and therefore generally located in one simple plane at or near a surface of the micromechanical device.

By the possibility of abandoning a precise adjustment or alignment and by a simple contacting of all electrodes the construction and connection technology is simplified compared to conventional micromechanical devices.

In other words, the object of the present invention is achieved by the fact that a moveable member suspended via elastic connecting elements or springs, respectively, is separated into several electrodes by insulating trenches or gaps or that an insulating moveable member comprises several electrodes in the form of conductive areas, for example metallizations. Each electrode or each insulating area of the moveable member which is electrically insulated from other areas, respectively, may be connected to one electric potential each via one or several elastic connecting elements. By the separation of the moveable member into areas with different electrostatic potentials one single counter-electrode may be used which must not be manufactured on one individual substrate, but which may for example be formed by a metal plate or another conductive plate or a plate provided with a conductive layer onto which a chip is glued which comprises the moveable member and the elastic connecting elements. In other words, the substrate of the micromechanical device comprises the metal plate or the other conductive plate or the plate provided with a conductive layer. To this end, the conductive plate may itself be a component of a housing of the micromechanical device. The latter substantially simplifies the construction and connection process, as a standard housing may be used which has a metallized housing bottom.

As one single planar static counter-electrode is used and a plurality of electrodes for obtaining a deflection or for detecting a deflection of the moveable member are integrated in the same, an adjustment or a lateral alignment of the electrodes to each other may be completely omitted during the manufacturing process.

The manufacturing of the device is performed using known methods of surface micromechanics and volume micromechanics. By grinding the substrate or by using a spacer on a front or back side of the chip, which includes the moveable member and the elastic connecting elements, it is possible to vary the distance between opposing electrodes, for example between the first and the third electrode or between the second and the third electrode in a wide range and therefore to optimize the micromechanical device with respect to the special task.

BRIEF DESCRIPTION OF THE DRAWINGS

In the following, preferred embodiments of the present invention are explained in more detail with reference to the accompanying drawings, in which.

DESCRIPTION OF PREFERRED EMBODIMENTS OF THE INVENTION

FIG. 1 to 5 are schematical principle illustrations which are not in scale, in which a base plate comprising the counter-electrode is illustrated depressed or spaced apart, respectively, with reference to the other components of the micromechanical device for a better understanding. The Figs. may therefore be considered as instantaneous pictures in a manufacturing process of a hybridly constructed micromechanical device. Although the micromechanical device according to the present invention comprises the above-discussed advantage especially in case of a hybrid construction, not to require a lateral adjustment of the electrodes, the micromechanical device may also comprise an integrated construction according to the present invention, which at least comprises the above-illustrated advantage of the simple contacting of the electrodes.

Figure 1:
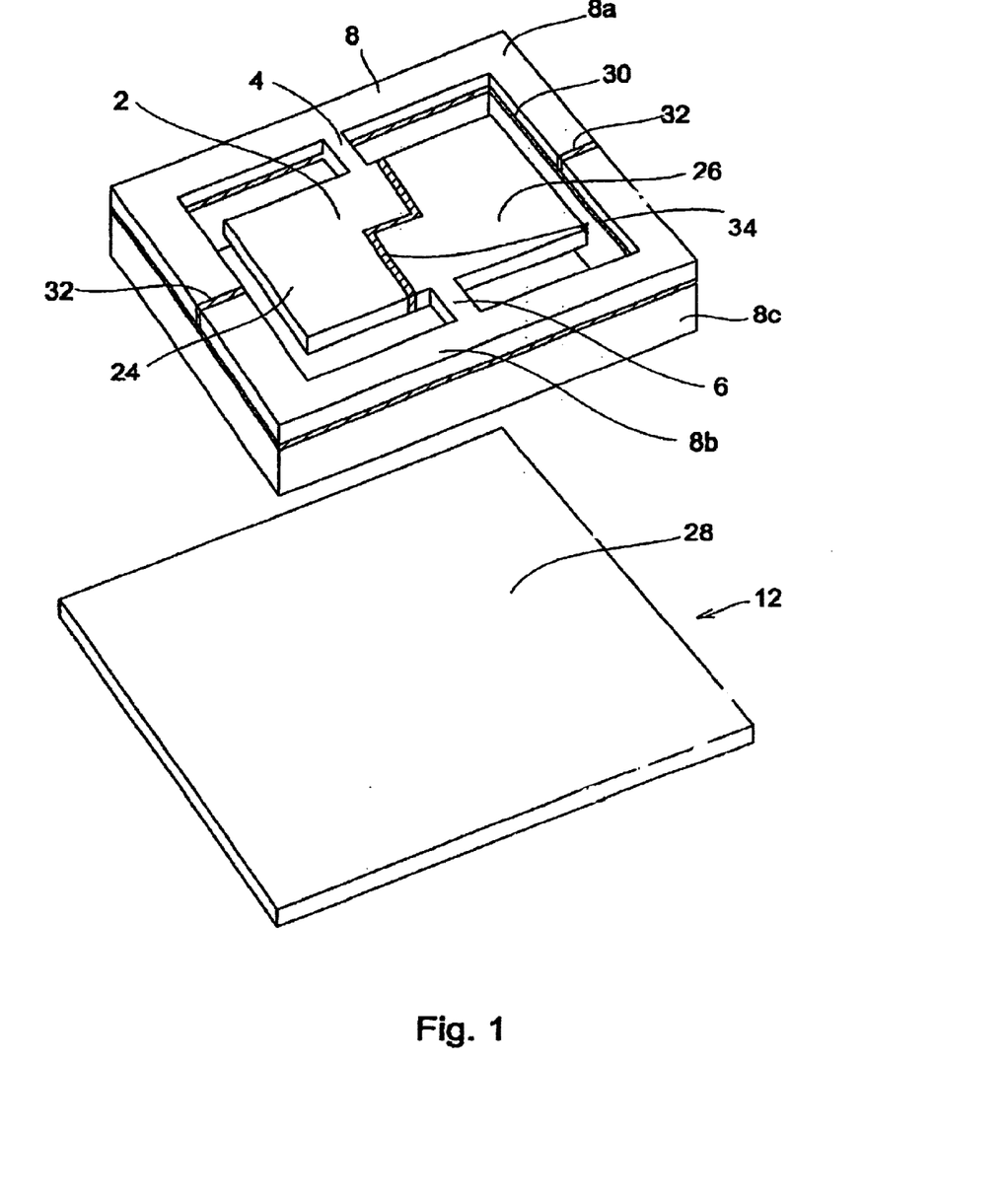
FIG. 1 shows a schematical perspective illustration of an embodiment of the micromechanical device according to the present invention.

FIG. 1 shows a schematical perspective illustration of a torsion actuator according to the present invention. A moveable device 2 is basically plate-shaped and comprises a rectangular plan view. In the centers of the two longer sides of the moveable member 2 the same is respectively connected to one end of a first torsion-elastic connecting element 4 and a second torsion-elastic connecting element 6. Ends of the connecting elements 4, 6 facing away from the moveable member 2 are connected to a frame 8 which encloses the moveable member 2 in a lateral direction and is spaced apart from the same. The moveable member 2, the connecting elements 4, 6 and the frame 8 are implemented integrally. The frame 8 comprises three areas 8a, 8b and 8c, which are electrically insulated from each other. The moveable member 2 comprises two areas which are electrically insulated from each other which form a first electrode 24 and a second electrode 26. The first electrode 24 is connected to the first connecting element 4 and the first area 8a of the frame 8 in an electrically conductive way. The second electrode 26 is connected to the second connecting element 6 and the second area 8b of the frame 8 in an electrically conductive way. Basically in parallel to the moveable member 2, spaced apart and electrically insulated from the same, a conductive plate 12 is arranged which forms a third electrode 28.

The moveable member 2, the connecting elements 4, 6 and the frame 8 are manufactured from a highly doped silicon wafer having a buried insulation layer 30 using conventional processing steps of semiconductor technology. The buried insulation layer 30 insulates the third area 8c of the frame 8 from the first area 8a and the second area 8b in the completed micromechanical device. The frame 8 may therefore be directly attached to the electrically conductive plate 12 using its third area 8c without short circuiting the first electrode 24 or the second electrode 26 with the third electrode 28. Into the highly doped silicon layer, from which the moveable member 2, the connecting elements 4, 6 and the third and the second area 8a, 8b of the frame 8 emerge, which lies above the buried insulation layer 30, trenches 32, 34 are etched during the manufacturing process which range from the side of the silicon layer facing away from the buried insulation layer 30 to the buried insulation layer 30. The trench 34 in the area of the later moveable member 2 is subsequently filled with an electrically insulating material. This is preferably done before layers lying below the later moveable device 2 are removed. The trenches 32 insulate the first area 8a and the second area 8b or the first electrode 24 and the second electrode 26 from each other, respectively, wherein the trenches 32 in the area of the frame 8 need not be filled with an electrically insulating material. The filled trench 34 in the area of the moveable member 2 simultaneously establishes a rigid mechanical connection between the first electrode 24 and the second electrode 26.

The buried insulation layer 30 serves as an etch stop during the manufacturing process, so that its distance to the surface of the silicon wafer which is later spaced apart from the electrically conductive plate 12 simultaneously defines the thickness of the moveable member 2 and the connecting elements 4, 6.

As the electrically conductive plate 12 forming the third electrode 28 does not comprise a lateral structure, an alignment or adjustment of the electrically conductive plate 12 with respect to the moveable member 2 or the first electrode 24 and the second electrode 26, respectively, is not required during manufacturing. At the completed micromechanical device contacts at the surfaces of the first area 8a and the second area 8b of the frame 8 as well as at the electrically conductive plate 12 are provided, which are not illustrated. These contacts are preferably connected to two voltage sources using wire bonding technology, so that any two voltages between the first electrode 24 and the third electrode 28 or between the second electrode 26 and the third electrode 28, respectively, may be applied. The third electrode may alternatively be implicitly contacted by a connection within the housing or be connected to the voltage sources, respectively. A voltage between the first electrode 24 and the third electrode 28 results in a force which draws the first electrode 24 to the third electrode 28. A voltage between the second electrode 26 and the third electrode 28 results in a force which draws the second electrode 26 to the third electrode 28. Depending on the fact, whether between the first electrode 24 and the third electrode 28 or between the second electrode 26 and the third electrode 28 a higher voltage is applied, and depending on the height of the voltage or on the height of the difference of two applied voltages, respectively, the moveable member 2 tilts to the left or the right in the illustration shown in FIG. 1. This tilting remains as long as the electrical voltage is applied.

One possible application of the micromechanical device according to the embodiment of the present invention illustrated in FIG. 1 is the reflection of a light-beam at the moveable member 2, wherein the direction in which the light-beam is reflected or the reflection angle, respectively, depends on the magnitude of the voltages between the first electrode 24 and the third electrode 28 or between the second electrode 26 and the third electrode 28, respectively. Thereby it is possible, for example, to deviate a light-beam which is reflected as the moveable member statically, quasi-statically or continuously. To this end, the surface of the moveable member 2 facing away from the electrically conductive plate 12 is preferably implemented planar and reflective.

The arrangement of the torsion-elastic connecting elements 4, 6 defines an axis around which the moveable member 2 is rotationally moveable. The illustration in FIG. 1 shows a moveable member 2 which is suspended symmetrically, i.e. the center of gravity of the moveable member 2 lies on the axis defined by the torsionelastic connecting elements 4, 6.

The embodiment of a micromechanical device according to the present invention illustrated in FIG. 1 is not only useable as a torsion actuator, as it is illustrated above, but also as a sensor. If the moveable member 2 is not suspended symmetrically using the torsion-elastic connecting elements 4, 6, but if the center of gravity of the moveable member 2 lies outside the axis defined by the torsion-elastic connecting elements 4, 6, an acceleration of the micromechanical device in a direction perpendicular to the plane defined by the center of gravity of the moveable member 2 and the connecting elements 4, 6 causes a tilting of the moveable member 2, wherein the capacities between the first electrode 24 or the second electrode 26, respectively, and the third electrode 28 change. When the moveable member 2 in the illustration in FIG. 1 tilts to the left, the first electrode 24 approaches the third electrode 28, whereby the capacity between the first electrode 24 and the third electrode 28 is decreased. Simultaneously, the capacity between the second electrode 26 and the third electrode 28 increases accordingly. Thereby it is possible, by a measurement of the two capacities between the first electrode 24 or the second electrode 26, respectively, and the third electrode 28, to determine the tilting or deflecting, respectively, of the moveable member 2 quantitatively from its inoperated position. Such a system may for example be used as an acceleration sensor.

A micromechanical device having a symmetrically suspended moveable member 2 is accordingly suitable for detecting an angular acceleration, i.e. a change of rotation around an axis which is not parallel to the axis defined by the elastic connecting elements 4, 6.

Further, it is possible to measure a force or a torque using the micromechanical device according to the present invention, which is for example transmitted by rams or levers to the moveable member 2 or applied to the same by the pressure or the flow of a fluid.

Electrostatic forces between the first electrode 24, the second electrode 26 and the third electrode 28 may further be used to compensate for an exterior force or to reduce a deflection of the moveable member 2 by an exterior force or acceleration.

Figure 2:
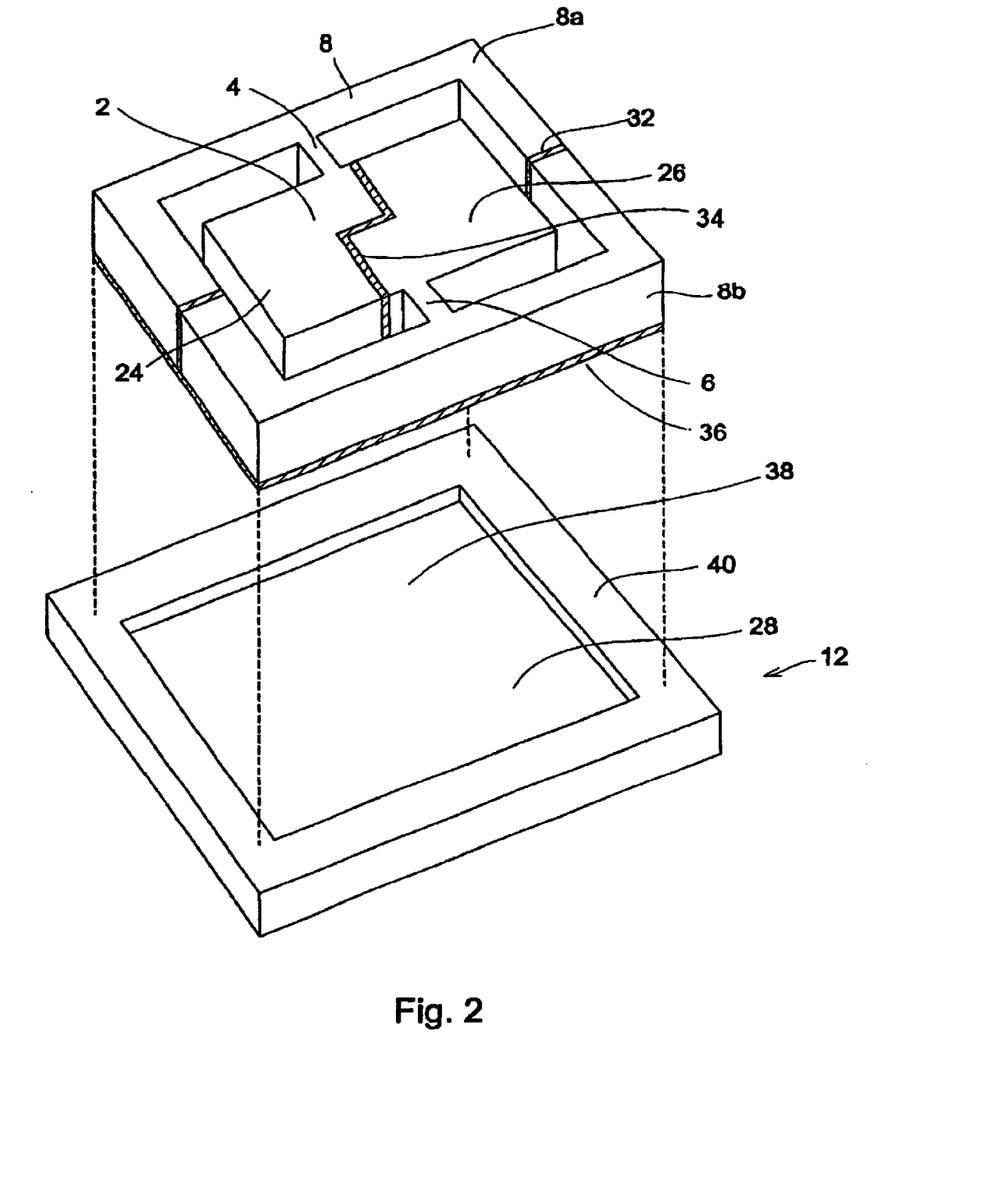
FIG. 2 shows a schematical perspective illustration of a further embodiment of a micromechanical device according to the present invention.

FIG. 2 shows a further embodiment of the micromechanical device according to the present invention, which also comprises a moveable member 2, which is separated by a trench filled with an insulating material into a first electrode 24 and a second electrode 26 electrically insulated from the first electrode 24 by the trench 34. The moveable member 2 is itself connected to a frame 8 at opposing sides by a first torsion-elastic connecting element 4 and a second torsion-elastic connecting element 6. The frame 8 is separated into a first area 8a and a second area 8b by electrically insulating trenches 32. The first area 8a of the frame 8 is connected to the first electrode 24 in an electrically conductive way via the torsion-elastic connecting element 4, and the second area 8b of the frame 8 is connected to the second electrode 26 in an electrically conductive way via the second torsion-elastic connecting element 6. In contrast to the embodiment of FIG. 1, a silicon layer from which the moveable member, the torsion-elastic connecting elements 4, 6 and the frame 8 are manufactured does not comprise any buried insulation layer. For an electric insulation of the first area 8a and the second area 8b of the frame 8 and with the same also of the first electrode 24 and the second electrode 26 against an electrically conductive plate 12 forming the third electrode 28, an electrically insulating layer 36 is provided between the electrically conductive plate 12 and the frame 8, so that the first electrode 24, the second electrode 26 and the third electrode 28 are electrically insulated from each other completely.

In this embodiment, the moveable member 2 and the frame 8 comprise the same thickness. The electrically conductive plate 12 is provided with a depression 38 which is opposed to the moveable member 2 and allows its deflection from the inoperated position. In other words, in this embodiment an edge 40 enclosing the depression 38 forms a spacer which basically generates a spacing between the moveable member 2 and the third electrode 28 formed by the depression 38 of the electrically conductive plate 12. The alignment or adjustment, respectively, of the electrically conductive plate 12 or the depression 38 in the same, respectively, with the moveable member 2 is relatively uncritical and may for example be performed by simple mechanical stops if the frame 8 and the depression 38 are implemented large enough.

The frame 8 or the insulation layer 36, respectively, on the one hand and the raised edge 40 of the electrically conductive plate 12 on the other hand may for example be connected to each other by an adhesive connection. An electrical contacting and possible uses as an actuator or a sensor are identical to the ones of the embodiment illustrated in FIG. 1.

Figure 3:
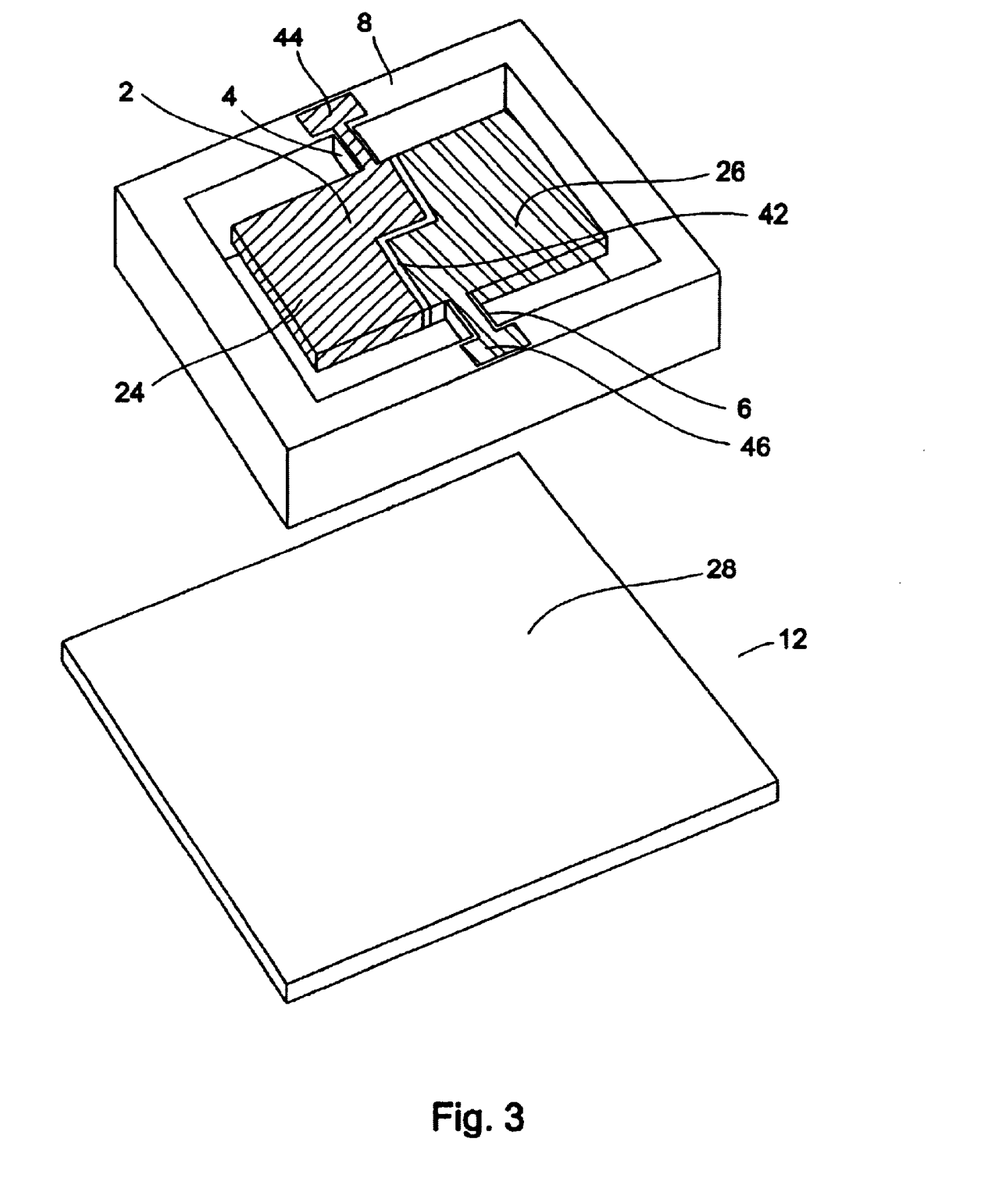
FIG. 3 shows a schematical perspective illustration of a further embodiment of a micromechanical device according to the present invention.

FIG. 3 shows a further embodiment of the micromechanical device according to the present invention, whose basic geometry corresponds to the embodiment from FIG. 1, wherein, however, the moveable member 2, the torsion-elastic connecting elements 4, 6 and the frame 8 comprise an electrically insulating material, for example undoped silicon. In this embodiment, the first electrode 24 and the second electrode 26 are formed by metallizations on surfaces of the moveable member, which are electrically insulated from each other by a void 42. The metallization forming the first electrode 24 thereby basically extends starting from the axis formed by the torsion-elastic connecting elements 4, 6 up to an edge of the moveable member 2 distanced from this axis. The metallization forming the second electrode 26 extends basically from the axis to a further edge of the moveable member 2 spaced apart from the axis. The first electrode 24 and the second electrode 26 therefore comprise lateral extensions corresponding to the ones from the embodiment illustrated in FIG. 1, are, however, not formed by the material of the moveable member 2 itself but by metallizations on its surface. The metallization forming the first electrode 24 further extends via the first torsion-elastic connecting element 4 to the frame 8, wherein it forms a first contact point 44 on its surface. The metallization forming the second electrode 26 further extends via a surface of the second torsion-elastic connecting element 6 to the frame 8 forming a second contact point 46 on its surface. For contacting the first electrode 24 and the second electrode 26 for example using wire bonding technology, electrically conductive connections to the contact points 44, 46 are established.

In the embodiment illustrated in FIG. 3, the moveable member 2 comprises a smaller thickness than the frame 8, which may for example be realized by an etching limited in time from the backside with the known etching rate.

As the frame 8 comprises an insulating material, it may be directly connected to the electrically conductive plate 12 forming the third electrode 28, for example by adhering or bonding.

Figure 4:
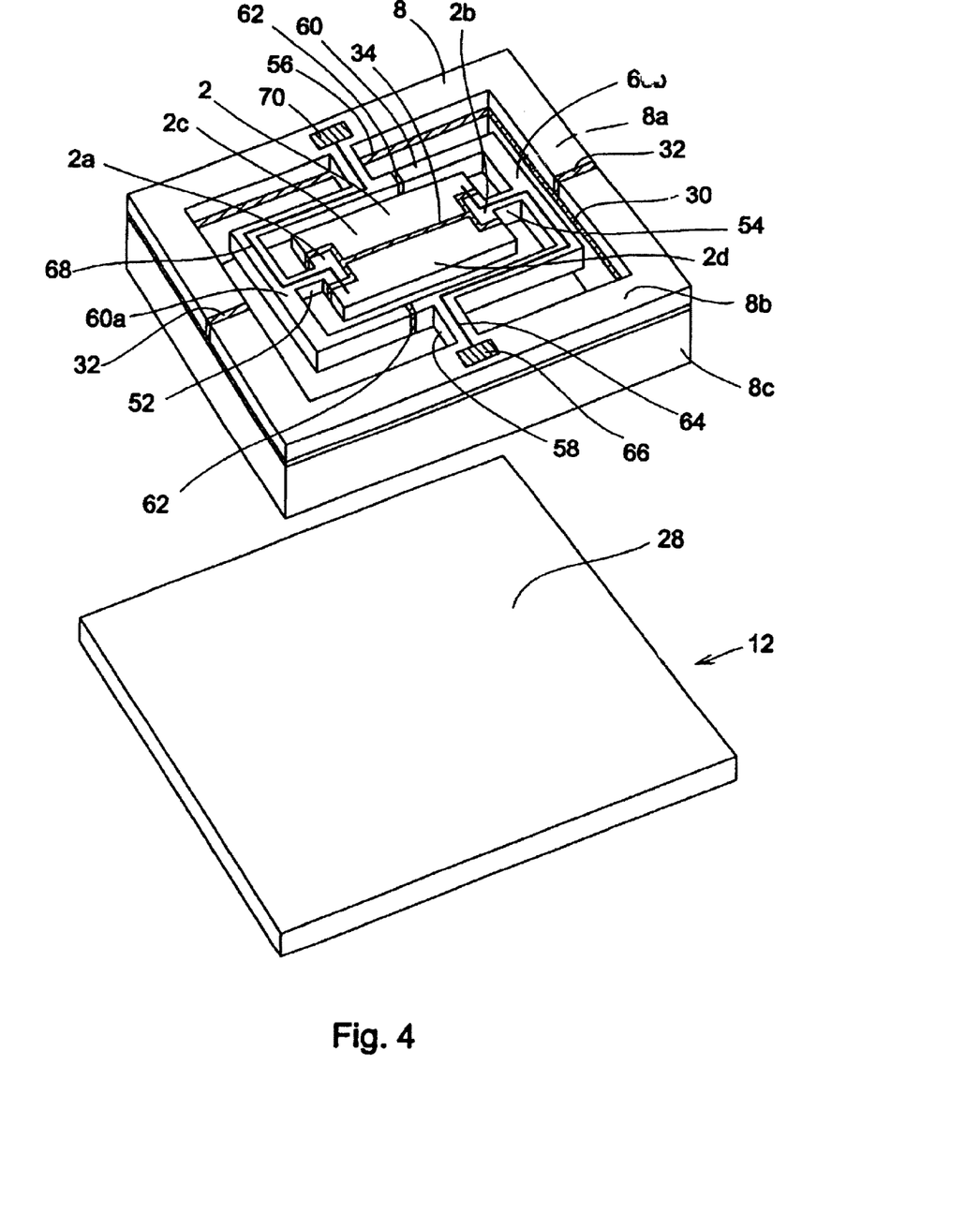
FIG. 4 shows a schematical perspective illustration of a further embodiment of a micromechanical device according to the present invention.

FIG. 4 is a schematical perspective illustration of a fourth embodiment of the micromechanical device according to the present invention. A moveable member 2 is here connected to a frame 8 via four torsion-elastic connecting elements 52, 54, 56, 58 and one intermediate frame 60. The moveable intermediate frame 60 completely laterally encloses the moveable member and is itself completely laterally enclosed by the frame 8. The moveable member 2 has the form of a rectangular plate and is, at two opposing sides, respectively, centrically connected via a first torsion-elastic connecting element 52 and a second torsion-elastic connecting element 54 to two opposing sides of the intermediate frame 60 which is also rectangular-shaped and moveable. The other two opposing sides of the moveable intermediate frame 60 are each centrically connected to opposing sides of the frame 8 by a third torsion-elastic connecting element 56 and a fourth torsion-elastic connecting element 58. A kardanic suspension of the moveable member 2 results, wherein the moveable member 2 is rotatable with respect to the moveable intermediate frame 60 and the frame 8 around an axis defined by the first and the second torsion-elastic connecting element 52, 54, and wherein the moveable member 2 and the moveable intermediate frame 60 together are rotatable around a second axis with respect to the frame 8 rectangular to the first axis and defined by the third and the fourth torsion-elastic connecting element 56, 58.

The moveable member 2, the connecting elements 52, 54, 56, 58, the moveable intermediate frame 60 and the frame 8 are manufactured from a doped, electrically conductive silicon wafer comprising a buried insulation layer, like the moveable member 2, the connecting elements 4, 6 and the frame 8 from the embodiment illustrated in FIG. 1. The frame 8 comprises electrically insulating trenches 32 which separate the same together with the buried insulation layer 30 into a first area 8a, a second area 8b and a third area 8c, which are electrically insulated from each other. The first area 8a of the frame 8 abuts on the third torsion-elastic connecting element 56 and the second area 8b of the frame 8 abuts on the fourth torsion-elastic connecting element 58. The moveable intermediate frame 60 is separated into a first area 60a abutting on the first and on the third torsion-elastic connecting element and a second area 60b abutting on the second and the fourth connecting element 54, 58 by trenches 62 filled with an insulating material, wherein the first area 60a and the second area 60b of the moveable intermediate frame are mechanically rigidly connected to each other and electrically insulated from each other by trenches 62 filled with an insulating material. The trenches 62 are thereby preferably arranged near the first connecting element 56 or the second connecting element 58, respectively. The moveable member 2 is separated into four areas 2a, 2b, 2c, 2d by a trench 34 filled with an insulating material and branched once at both ends, wherein the areas are mechanically rigidly connected to each other and electrically insulated from each other by the trench 34 filled with an insulating material.

The third area 8c of the frame 8 is for example connected to the electrically conductive plate 12 by an adhesive bonding.

The first area 2a of the moveable member 2 abuts on the first torsion-elastic connecting element 52 and is electrically conductively connected to the first area 8a of the frame 8 via the same, the first area 60a of the moveable intermediate frame 60 and the third torsion-elastic connecting element 56. The second area 2b of the moveable member 2 abuts on the second torsion-elastic connecting element 54 and is electrically conductively connected to the second area 8b of the frame 8 via the same, the second area 60b of the moveable intermediate frame 60 and the fourth torsion-elastic connecting element 58. The third area 2c of the moveable member 2 is electrically conductively connected to a first contact point 66 via a first conductive trace 64 which runs across the second connecting element 54, the second area 60b of the moveable intermediate frame 60 and the fourth connecting element 58 and is electrically insulated from the same by a non-illustrated insulating layer, wherein the contact point is arranged on the second area 8b of the frame 8 and electrically insulated from the same by a not illustrated insulating layer. A fourth area 2*d* of the moveable member 2 is electrically conductively connected to a second contact point 70 by a second conductive trace 68 which runs across the first connecting element 52, the first area 60*a* of the moveable intermediate frame 60 and the third connecting element 56 and is electrically insulated from the same by a non-illustrated insulating layer, wherein the contact point is arranged on the first area 8*a* of the frame 8 and is electrically insulated from the same by a non-illustrated insulating layer.

A first electrode is formed by the first area 2*a* of the moveable member, the first connecting element 52 and the first area 60*a* of the moveable intermediate frame 60 and is electrically conductively connected to the first area 8*a* of the frame 8 via the third connecting element 56 and may therefore be contacted via a not illustrated further contact point at the first area 8*a* of the frame 8. A second electrode is formed by the second area 2*b* of the moveable member 2, the second connecting element 54 and the second area 60*b* of the moveable intermediate frame 60 and is electrically conductively connected to the second area 8*b* of the frame 8 via the fourth connecting element 58 and may therefore be contacted via a further not illustrated contact point at the second area 8*b* of the frame 8. A third electrode 28 is formed by an electrically conductive plate 12. A fourth electrode is formed by the third area 2*c* of the moveable member 2 and may be contacted via the first contact point 66. A fifth electrode is formed by the fourth area 2*d* of the moveable member 2 and may be contacted via the second contact point 70.

The thickness of the moveable member 2, the connecting elements 52, 54, 56, 58 and the intermediate frame 60 is defined by the arrangement of a buried insulation layer 30 within the used silicon wafer as in the embodiment illustrated in FIG. 1, as the buried insulation layer 30 serves as an etch stop in this embodiment. If a voltage is applied between the first electrode formed by the first area 2*a* of the moveable member 2, the first connecting element 52 and the first area 60*a* of the moveable intermediate frame 60, and the third electrode 28, the first electrode experiences an attracting force towards the third electrode 20*a,* and as the first electrode is positioned essentially left of the axis defined by the third and the fourth connecting element 56, 58 with regard to the illustration illustrated in FIG. 4, the moveable member 2 tilts around this axis to the left. Accordingly, the moveable member tilts to the right when a voltage between the second electrode formed by the second area 2*b* of the moveable member 2, the second connecting element 54 and the second area 60*b* of the moveable intermediate frame 60, and the third electrode 28 is applied. When a voltage is applied between the fourth electrode formed by the third area 2*c* of the moveable member 2 and the third electrode 28, the moveable member 2 tilts backwards around the axis defined by the first and the second torsion-elastic connecting elements 52, 54, when a voltage is applied between the fifth electrode formed by the fourth area 2*d* of the moveable member 2, and the third electrode 28, the moveable member 2 tilts forward around the same axis, as the fourth electrode is arranged basically behind this axis and the fifth electrode basically in front of this axis, in the illustration shown in FIG. 4.

The embodiment of a micromechanical device according to the present invention illustrated in FIG. 4 is therefore suitable to perform rotational movements around two axes perpendicular to one another controlled by four electrical voltages. This may for example be used for a two-dimensional deflection of a light-beam. In this case the surface of the moveable member 2 facing away from the third electrode 28 is preferably implemented planar and reflective. Further, the embodiment of a micromechanical device according to the present invention shown in FIG. 4 is suitable as a sensor for forces, accelerations or angular accelerations in two directions perpendicular to each other analogous to the implementation in connection with the embodiment shown in FIG. 1.

When the moveable member 2, as it is illustrated in FIG. 4, is suspended symmetrically, i.e. the center of gravity of the moveable member 2 lies on the axis defined by the first connecting element 52 and the second connecting element 54 and the center of gravity of the moveable member 2 together with the first connecting element 52, the second connecting element 54 and the moveable intermediate frame 60 lies on the axis defined by the third connecting element 56 and the fourth connecting element 58, the micromechanical device is suitable for a detection of a component of an angular acceleration in parallel to the two axes defined by the connecting elements 52, 54, 56, 58.

In variation from the embodiments of the micromechanical device according to the present invention illustrated in FIGS. 1 to 4, numerous modifications are possible. For example, the moveable member 2, the connecting elements 4, 6; 52, 54, 56, 58, the frame 8 and, if applicable, the moveable intermediate frame 60 may be implemented integrally or in several parts and may comprise the same or different materials. Apart from the described silicon material also other materials are possible, such as semiconductor materials, dielectrics or metals.

Further, features of different embodiments may be combined with each other. For example, the embodiment of FIG. 4 may be implemented from an undoped semiconductor material or from another non-conductive material according to the embodiment of FIG. 3, wherein the first, the second, the fourth and the fifth electrode are formed by electrically insulated metallizations on surfaces of the moveable member 2 and the moveable intermediate frame 60.

Further, the third electrode 28 may not only comprise one planar surface but alternatively also a patterned surface and/or may be provided with a level or patterned insulating layer, insulating stops, an insulating frame etc., in deviation from the illustrated embodiments, to prevent a short circuit between the first, second, fourth or fifth electrode 24, 26 on the one hand and the third electrode 28 on the other hand as well as an overload of the torsion-elastic connecting elements 4, 6; 52, 54, 56, 58 at a maximum deflection of the moveable member 2 or, if applicable, of the moveable intermediate frame 60, respectively. The same may be caused by respective structures from an insulating material at the moveable member 2, for example by an electrically insulating layer at the surface of the moveable member 2 facing the third electrode 28.

Instead of a suspension of the moveable member 2 at torsion-elastic connecting elements 4, 6; 52, 54, 56, 58, further an analogous implementation with bending-elastic connecting elements or a combination of torsion-elastic and bending-elastic connecting elements is possible. Further, the moveable member 2 may be tiltable or rotatable, respectively, not only around one or several axes but may alternatively or simultaneously be suspended translatably or shiftably, respectively, into one or several directions.

The moveable member 2 may be plate-shaped having two planar parallel surfaces and a rectangular plan-view, or it may comprise another suitable form for the respective application. It may for example comprise a structure on the surface facing away from the third electrode 28 which enables or allows a transmission of an exterior force to the moveable member.

Further, the moveable member 2 and the elastic connecting elements 4, 6; 52, 54, 56, 58 may comprise different thicknesses.

In all described embodiments, the frame 8 only represents one possibility of the mechanically rigid connection of the elastic connecting elements 4, 6; 56, 58 to the substrate. Alternatively, pillars, ribs or islands or other structures may be provided on the surface of the substrate 12, to which the elastic connecting elements 4, 6; 56, 58 are attached. Although it is possible and advantageous to manufacture the frame 8 together and integrally with the moveable member 2 and the elastic connecting elements 4, 6; 56, 58 and only connect the frame to the substrate 12 in a later manufacturing step, the frame 8 may therefore rather functionally be regarded as a part of the substrate.

Further, near the moveable member one or several static electrodes may be arranged. In the case of using the micromechanical device as an actuator in an optical application for a controlled deviation of a light-beam, it is for example possible to provide a transparent plate arranged over the side of the moveable member 2 facing away from the third electrode 28 and provided for the protection of the micromechanical device with a transparent conductive coating and to apply a voltage between the same and the third electrode 28, so that depending on the choice of the potential of the first electrode 24 and the second electrode 26 they are attracted not only by the third electrode 28 but also by the conductive coating of the transparent plate, whereby with comparable voltages a stronger deflection of the moveable member 2 is possible.

When two static electrodes are provided, like in the last described example the third electrode 28 and the transparent conductive coating, they may be arranged symmetrically with regard to the moveable member 2. By a symmetrical arrangement of the static electrodes with reference to the moveable member 2 and in particular with reference to the first electrode 24, the second electrode 26 and if applicable further electrodes, that the moveable member comprises, a symmetrization of the attacking electrostatic forces is obtainable, so that with a desired rotational movement a parasitic translation movement, which occurs when using only one static electrode or counter-electrode, respectively (on one side of the moveable member 2), is suppressed or strongly decreased. This is a main advantage for many applications.

Figure 6:
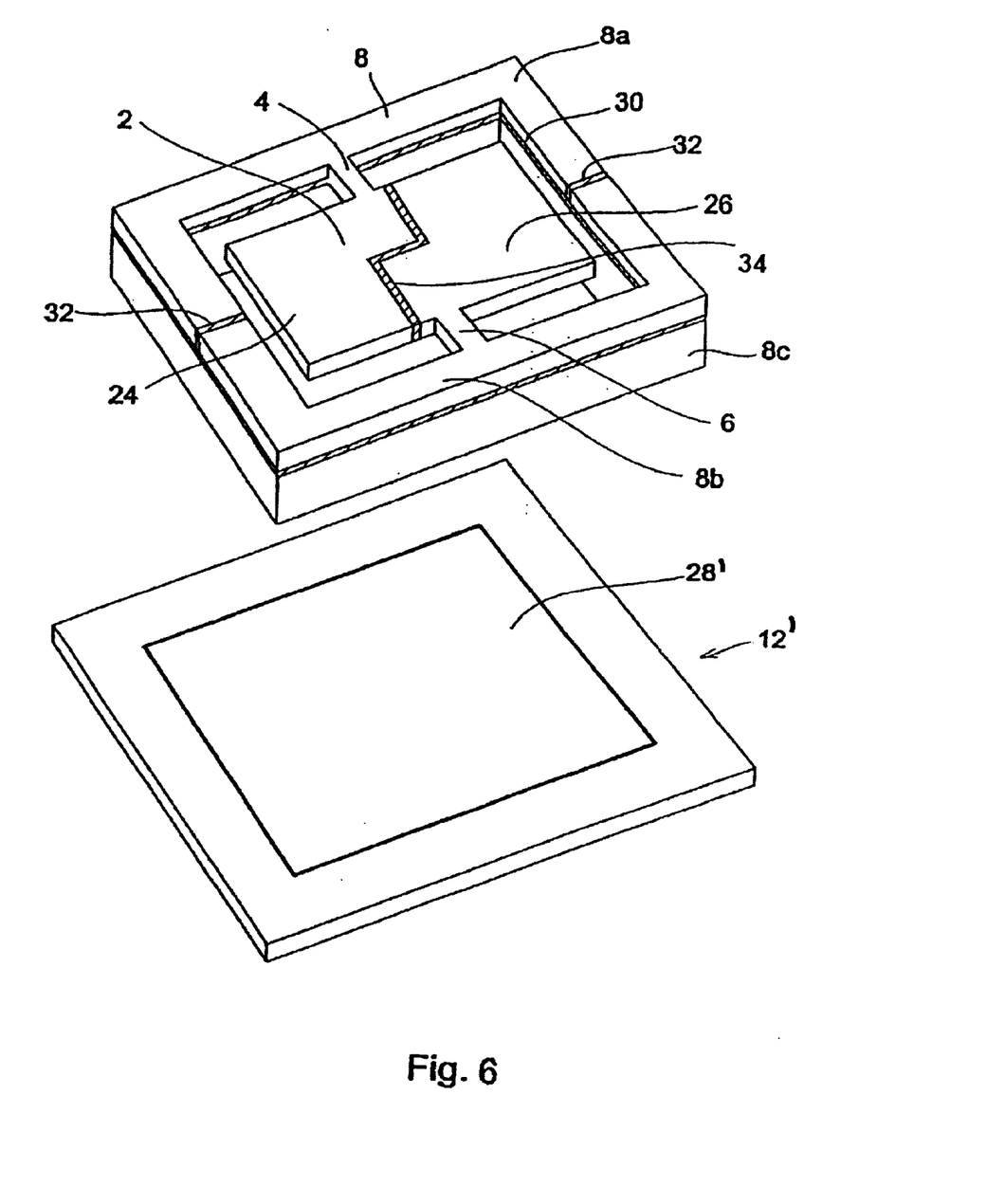
FIG. 6 shows a schematic perspective illustration of a modification of the embodiment shown in FIG. 1.
Figure 7:
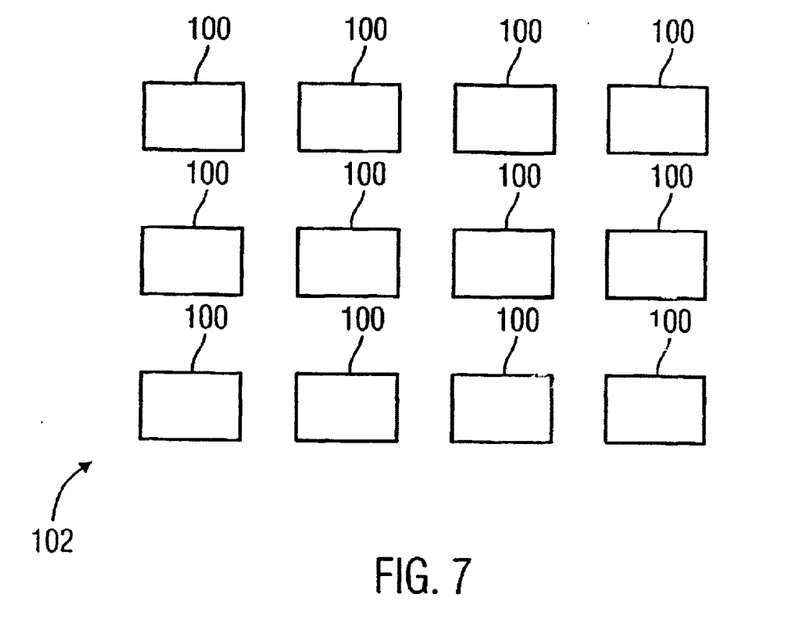
FIG. 7 shows a 2-dimensional array of micromechanical devices according to the invention.
Figure 8:
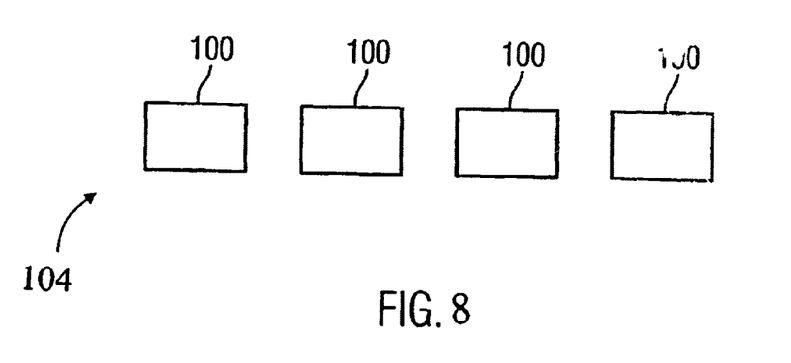
"and FIG. 8 shows a linear array of micromechanical devices according to the invention."

FIG. 6 shows a micromechanical device comprising a substrate 12' and a third electrode 28'. In a first embodiment, the substrate 12' comprises an electrically insulating material, wherein the third electrode 28' comprises a metallization of a surface of the substrate 12' opposite the moveable member. In another embodiment, the substrate 12' comprises a semiconductor material, wherein the third electrode 28' includes a doped area of the substrate 12'.

What is claimed is:

1. A micromechanical device comprising:
   a substrate;
   a member which is moveably attached to the substrate
   wherein the moveable member is formed in an electrically, conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, and
   wherein the substrate comprises a third electrode which is at least partially opposed to the first electrode and the second electrode;
   a frame;
   a first and a second torsion-elastic connecting element via which, at two opposing sides, the moveable member is connected to the frame rotationally moveable around a first axis;
   a third and fourth torsion-elastic connecting element via which, at two opposing sides, the frame is connected to the substrate rotationally moveable around a second axis;
   wherein the first axis and the second axis are basically perpendicular to each other, and
   wherein the moveable member further comprises a fourth electrode and a fifth electrode.

2. The micromechanical device according to claim 1, wherein the moveable member is plate shaped and comprises a first surface and a second surface,
   wherein the first electrode and the second electrode each occupy at least a partial area of the first surface or a partial area of the second surface.

3. The micromechanical device according to claim 1, further comprising:
   a first and a second bending-elastic connecting element, via which the moveable member is attached to the substrate.

4. The micromechanical device according to claim 1, wherein the substrate comprises an electrically conductive material.

5. The micromechanical device according to claim 1, wherein the substrate comprises an electrically insulating material, wherein the third electrode comprises a metallization of a surface of the substrate opposite the moveable member.

6. The micromechanical device according to claim 1 wherein the substrate comprises a semiconductor material, wherein the third electrode includes a doped area of the substrate.

7. The micromechanical device according to claim 1, further comprising a further electrode which is arranged in an immobile manner with respect to the substrate, and which is arranged symmetrically to the third electrode with respect to the moveable member.

8. A micromechanical device including a linear or a two dimensional array of micromechanical devices according to claim 1.

9. The micromechanical device according to claim 1 further comprising:
   a first and a second torsion-elastic connecting element via which the moveable member is attached to the substrate.

10. The micromechanical device according to claim 9, wherein the connecting elements and the moveable member comprise the same material.

11. The micromechanical device according to claim 9, wherein the first connecting element connects the first electrode to a first electrode to a first elastic conductor in an electrically conductive way, and wherein the second connecting element connects the second electrode to a second electric conductor in an electrically conductive way.

12. A micromechanical device, comprising:
    a substrate;
    a member which is moveably attached to the substrate,
    wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer.

wherein the substrate comprises a third electrode which is at least partially opposed to the first electrode and the second electrode, and wherein the electrically conductive material of the moveable member is a doped semiconductor material and the electrically insulating third area comprises an undoped semiconductor material or a trench filled by an electrically insulating material.

13. A micromechanical device comprising:

a substrate;

a member which is moveably attached to the substrate, wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, wherein the substrate comprises a third electrode which is at least partially opposed to the first electrode and the second electrode, and wherein an electrically conductive section of a housing forms the substrate and the third electrode.

14. A sensor, comprising a micromechanical device, said micromechanical device comprising:

a substrate;

a member which is moveably attached to the substrate, wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, wherein the substrate comprises a third electrode which is at least partially opposed to the first electrode and the second electrode, a frame;

a first and a second torsion-elastic connecting element via which, at two opposing sides, the moveable member is connected to the frame rotationally moveable around a first axis;

a third and fourth torsion-elastic connecting element via which, at two opposing sides, the frame is connected to the substrate rotationally moveable around a second axis;

wherein the first axis and the second axis are basically perpendicular to each other, and wherein the moveable member further comprises a fourth electrode and a fifth electrode.

wherein the moveable member is provided to be deflected by an exterior force, acceleration or angular acceleration, wherein a first capacity between the first electrode and the third electrode and a second capacity between the second electrode and the third electrode depend on a deflection state of the moveable member.

15. An actuator according to claim 14 for the deflection of light, wherein the member comprises a light-reflecting surface.

16. An actuator having a micromechanical device, said micromechanical device comprising:

a substrate;

a member which is moveably attached to the substrate;

wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, wherein the substrate comprises a third electrode which is at least partially opposed to the first electrode and the second electrode, a frame;

a first and a second torsion-elastic connecting element via which, at two opposing sides, the moveable member is connected to the frame rotationally moveable around a first axis;

a third and fourth torsion-elastic connecting element via which at two opposing sides, the frame is connected to the substrate rotationally moveable around a second axis;

wherein the first axis and the second axis are basically perpendicular to each other, and wherein the moveable member further comprises a fourth electrode and a fifth electrode.

wherein the moveable member is provided so that between the first electrode and the third electrode a first voltage and between the second electrode and the third electrode a second voltage is applied, wherein a deflection state of the member depend on the first voltage and the second voltage.

17. A sensor, comprising a micromechanical device, said micromechanical device comprising:

a substrate;

a member which is moveably attached to the substrate;

wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer;

wherein the substrate comprises a third electrode which is at least partially opposed to the first electrode and the second electrode, and wherein the electrically conductive material of the moveable member is a doped semiconductor material and the electrically insulating third area comprises an undoped semiconductor material or a trench filled by an electrically insulating material wherein the moveable member is provided to be deflected by an exterior force, acceleration or angular acceleration, wherein a first capacity between the first electrode and the third electrode and second capacity between the second electrode and the third electrode depend on a deflection state of the moveable member.

18. A sensors, comprising a micromechanical device, said micromechanical device comprising:

a substrate; and a member which is moveably attached to the substrate, wherein the moveable member is formed in an electrically conductive layer, wherein a first area of the moveable forms a first electrode, a second area of the moveable member forms a second electrode, and wherein the first electrode nod the second electrode are electrically insulated from each other by an electrically insulating third area which penetrates the conductive layer, wherein the substrate comprises a third electrode which is at least partially opposed to the first electrode and the second electrode, and wherein an electrically conductive section of a housing forms the substrate and the third electrode, wherein the moveable member is provided to be deflected by an exterior force, acceleration or angular acceleration, wherein a first capacity between the first electrode and the third electrode and a second capacity between the second electrode and the third electrode depend on a deflection state of the moveable member.

19. An actuator having a micromechanical device, said micromechanical device comprising:

a substrate;

a member which is moveably attached to the substrate, wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, wherein the substrate comprises a third electrode which at least partially opposed to the first electrode and the second electrode, and wherein the electrically conductive material of the moveable member is a doped semiconductor material and the electrically insulating third area comprises an undoped semiconductor material or a trench filled by an electrically insulating material, wherein the moveable member is provided so that between the first electrode and the third electrode a first voltage and between the second electrode and the third electrode a second voltage is applied, wherein a deflection state of the member depend on the first voltage and the second voltage.

20. An actuator having a micromechanical device, said micromechanical device comprising:

a substrate;

a member which is moveably attached to the substrate, wherein the moveable member is formed in an electrically conductive layer, wherein a first area of the moveable member forms a first electrode, a second area of the moveable member forms a second electrode, and wherein the first electrode and the second electrode are electrically insulated from each other by an electrically insulating third area which penetrates the conductive layer, wherein the substrate comprises a third electrode which at least partially opposed to the first electrode and the second electrode, and wherein an electrically conductive section of a housing forms the substrate and the third electrode, wherein the moveable member is provided so that between the first electrode and the third electrode a first voltage and between the second electrode and the third electrode a second voltage is applied, wherein a deflection state of the member depend on the first voltage and the second voltage.

* * * * *

UNITED STATES PATENT AND TRADEMARK OFFICE
CERTIFICATE OF CORRECTION

PATENT NO. : 7,078,778 B2 Page 1 of 1
APPLICATION NO. : 10/485284
DATED : July 18, 2006
INVENTOR(S) : Harald Schenk

It is certified that error appears in the above-identified patent and that said Letters Patent is hereby corrected as shown below:

Title Page, [73] Assignee:, replace "Fraunhofer-Gessellschaft zur Foerderung der angewandten Forschung e.V."

With -- Fraunhofer-Gesellschaft zur Foerderung der angewandten Forschung e.V. --

Signed and Sealed this

Second Day of January, 2007

JON W. DUDAS
*Director of the United States Patent and Trademark Office*